United States Patent [19]
Murata

[11] Patent Number: 4,841,275
[45] Date of Patent: Jun. 20, 1989

[54] THICK-FILM INTEGRATED CIRCUIT DEVICE CAPABLE OF BEING MANUFACTURED BY MEANS OF EASY-TO-PERFORM TRIMMING OPERATION

[75] Inventor: Mitsuru Murata, Yokohama, Japan

[73] Assignee: Kabushiki Kaisha Toshiba, Kawasaki, Japan

[21] Appl. No.: 127,160

[22] Filed: Dec. 1, 1987

[30] Foreign Application Priority Data

Dec. 2, 1986 [JP] Japan ............................... 61-287128

[51] Int. Cl.⁴ .......................................... H01C 10/100
[52] U.S. Cl. .............................. 338/195; 219/121.69
[58] Field of Search ............... 338/195, 322, 323, 324, 338/334; 219/121.68, 121.69, 541

[56] References Cited

U.S. PATENT DOCUMENTS

| | | | |
|---|---|---|---|
| 2,748,234 | 5/1956 | Clarke et al. | 338/155 |
| 3,669,733 | 12/1969 | Allington | 338/195 X |
| 4,163,315 | 8/1979 | Neese | 338/195 X |

FOREIGN PATENT DOCUMENTS

| | | | |
|---|---|---|---|
| 1191277 | 5/1970 | United Kingdom | 338/195 |
| 1469321 | 4/1977 | United Kingdom | 338/195 |

*Primary Examiner*—C. L. Albritton
*Attorney, Agent, or Firm*—Cushman, Darby & Cushman

[57] ABSTRACT

A thick-film integrated circuit device comprises an insulating substrate, first and second conductors, formed on the insulating substrate by means of a thick-film forming method and spaced apart from each other, and a resistance-trimming resistor and a function-trimming resistor, both formed on the insulating substrate by means of the thick-film forming method. Both resistors are rectangular strips. The resistance-trimming resistor has two ends overlapping and thus electrically connected to the facing ends of the first and second conductors, respectively. The function-trimming resistor extends perpendicular to the second conductor, and has one end portion which extends at right angles to, overlaps and is therefore electrically coupled to the thin intermediate portion of the second conductor. A laser beam is applied onto the resistance-trimming resistor, while the resistance between those ends of the first and second conductors which face away from each other is being measured, thereby cutting a notch in the function-trimming resistor and thus greatly adjusting this resistance. A laser beam is applied onto the function-trimming resistor, thereby cutting a notch therein, cutting the resistor into two parts, and thus minutely adjusting the resistance between said ends of the first and second conductors.

6 Claims, 1 Drawing Sheet

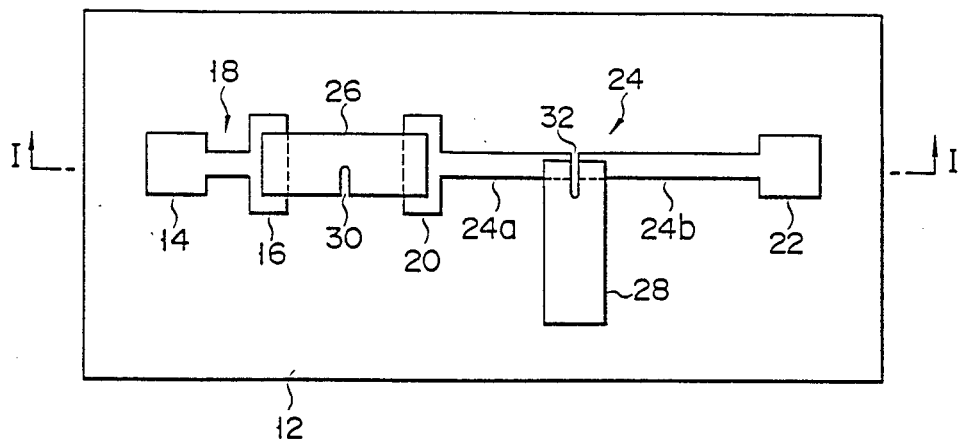
F I G. 1
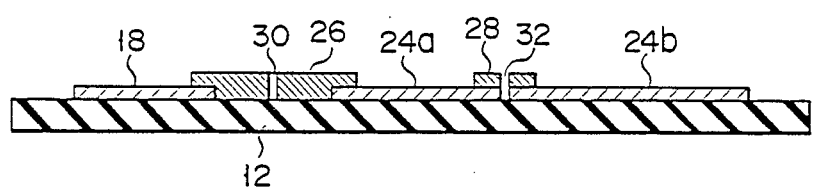
F I G. 2
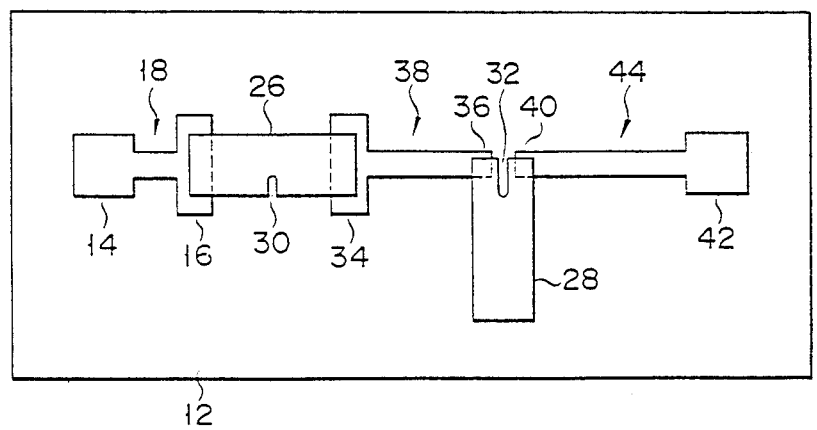
F I G. 3

THICK-FILM INTEGRATED CIRCUIT DEVICE CAPABLE OF BEING MANUFACTURED BY MEANS OF EASY-TO-PERFORM TRIMMING OPERATION

BACKGROUND OF THE INVENTION

This invention relates to a thick-film integrated circuit device, and more particularly, to a thick-film integrated circuit device which has a resistance-trimming resistor and a function-trimming resistor, and can be manufactured by means of an easy-to-perform trimming opera ion.

Most thick-film hybrid IC (integrated circuit) devices have an insulating substrate on which resistors are formed by means of a thick-film forming method consisting the steps of forming layers of resistive paste on the substrate and firing these resistive paste layers. Electronic components are mounted on the insulating substrate. The resistance which the device has after the electronic components have been provided on the substrate is different from the desired value by 10 to 25%, due to the difficulties of preparing a paste of the desired composition, and forming and firing the paste layers under appropriate conditions.

To correct the resistance of the thick-film hybrid IC device, technique called "trimming" is performed. More specifically, a resistance-trimming resistor and a function-trimming resistor are formed on the insulating substrate, by means of thick-film method. Then, a laser beam is applied to resistance-trimming resistor, thereby removing a portion of the resistor. This process is called "resistance trimming." Thereafter, a laser beam is applied to the function-trimming resistor, thus removing a portion of the function-trimming resistor. This process is called "function trimming." The resistance trimming and the function trimming, thus performed, impart the desired resistance to the thick-film hybrid IC device.

A thick-film hybrid IC device of the type described above comprises an insulating substrate, three conductors, a resistance-trimming resistor, and a function-trimming resistor. The conductors are rectangular strips formed on the insulating substrate and arranged in a line, spaced apart from one another. The three conductors and the two trimming resistors are made by means of the thick-film forming method. The first conductor has a pad portion at one end, and a connecting portion at the other end. The second conductor, which is located between the first and third conductors, has two connecting portions at the ends, respectively. The third conductor has a pad portion at one end, and a connecting portion at the other end. The resistance-trimming resistor, which is a rectangular strip, is formed on the substrate, with two ends overlapping the connecting portion of the first conductor and one connecting portion of the second conductor, respectively. The function-trimming resistor, which is also a rectangular strip, is formed on the substrate, with two ends overlapping the other connecting portion of the second conductor and the connecting portion of the third conductor, respectively. Hence, the resistance-trimming resistor is electrically connected to the first and second conductors, and the function-trimming resistor is electrically coupled to the second and third conductors.

As has been mentioned, the resistance of the thick-film hybrid IC devices is corrected by means of trimming. The trimming is carried out, while the resistance between the pad portions of the first and third conductors is being measured. First, a laser beam is applied to the resistance-trimming resistor, thus cutting a notch in this resistor. Next, electronic components, including capacitors, are mounted on the insulating substrate. Finally, a laser beam is applied to the function-trimming resistor, thereby cutting a notch in the function-trimming resistor, while the time constant of the circuit composed of the electronic components is being measured. The resistance of the thick-film hybrid IC device is thus determined by the two trimming operations.

Before a notch is cut in the resistance-trimming resistor, the thick-film hybrid IC device has a resistance different from the desired value by 10 to 25%. It is extremely difficult to trim resistance-trimming resistor to such extent that this resistance difference is completely eliminated. A considerable resistance difference still remains even after the resistance-trimming resistor has been trimmed and the electronic components have been mounted on the insulating substrate. Hence, in some cases, a relatively long notch must be cut in the function-trimming resistor, in order that the device may have a resistance substantially equal to the desired value. When the notch cut in the function-trimming resistor is too long, however, the resistor has too narrow a current path, with the result that an abnormally high level of heat will be generated therein.

SUMMARY OF THE INVENTION

Accordingly, it is the object of the present invention to provide a thick-film integrated circuit device, wherein an appropriate resistance-trimming degree can easily be determined, and a function-trimming resistor can have a current path broad enough to ensure that an abnormally large amount of heat will not be generated.

According to the present invention, there is provided a thick-film integrated circuit device comprising an insulating substrate, first and second conductors formed on the insulating substrate and spaced apart from each other, at least one of the conductors having an elongated intermediate portion, trimming resistor formed on the insulating substrate and having two ends overlapping and electrically connected to the first and second conductors for coarsely adjusting the resistance of the integrated circuit device, and function-trimming resistor formed on the insulating substrate in the form of a strip, electrically coupling and extending from the elongated intermediate portion, for finely adjusting the resistance of the integrated circuit device.

BRIEF DESCRIPTION OF THE DRAWINGS

These and other features of the present invention will become more apparent from the following detailed description of exemplary embodiments thereof, as illustrated in the accompanying drawings, in which:

FIG. 1 is a schematic plan view showing a thick-film integrated circuit device according to a first embodiment of the present invention;

FIG. 2 is a cross-sectional view, taken long line I—I in FIG. 1; and

FIG. 3 is a schematic plan view showing a thick-film integrated circuit device according to a second embodiment of the present invention.

DETAILED DESCRIPTION OF THE PREFERRED EMBODIMENTS

An embodiment of the present invention will be described with reference to FIGS. 1 and 2.

As is shown in these figures, first conductor 18 and second conductor 24, both made of copper or the like, are formed on insulating substrate 12 made of alumina or the like. These conductors 18 and 24 are arranged in a straight line and set apart from each other. First conductor 18 comprises pad portion 14, connecting portion 16, and an intermediate portion connecting portions 14 and 16. Second conductor 24 comprises connecting portion 20, pad portion 22, and a long intermediate portion connecting portions 20 and 22. Resistance-trimming resistor 26 for a first resistor and function-trimming resistor 28 for a second resistor, both made of a material whose main component is ruthenium oxide, are formed on insulating substrate 12 by means of a thick-film forming method. Resistor 26 is rectangular and axially aligned with conductors 18 and 24, with two ends overlapping and thus electrically connected to connecting portions 16 of first conductor 18 and connecting portion 20 of second conductor 24. Resistor 28 is also rectangular and extends perpendicular to second conductor 24, with one end overlapping and thus electrically connected to the long intermediate portion of second conductor 24. Both resistors 26 and 28 directly contact insulating substrate 12, except for the end portions overlapping connection portions 16 and 20 and the intermediate portion of conductor 24. These end portions are so small that the resistance between pad portion 14 of first conductor 18 and pad portion 22 of second conductor 24 is negligible.

It will now be explained how resistance-trimming resistor 26 and function-trimming resistor 28 are trimmed to adjust the resistance of the thin-film integrated circuit device to a desired resistance $R_f$. The following explanation is made on the assumption that resistor 26 has resistance $R_1$, resistor 28 has resistance $R_2$, and the integrated circuit device can have a minimum resistance $R_{min}$ and a maximum resistance $R_{max}$ after its electronic components have been mounted on insulating substrate 12. The desired resistance $R_f$ of the device is somewhere between the minimum value $R_{min}$ and the maximum value $R_{max}$.

First, while the resistance between pad portions 14 and 22 is being measured, a laser beam is applied onto resistance-trimming resistor 26, thereby cutting notch 30 in resistor 26. The laser beam is continuously applied until notch 30 elongates such that the resistance between pad portions 14 and 22, i.e., $(R_1+R_2)$, changes to $R_{min}$. Since one end of function-trimming resistor 28 overlaps second conductor 24 and is short-circuited therewith, resistance $R_2$ is negligible, and hence, $R_{min}$ is approximately equal to $R_1$.

Then, electronic components, including capacitors, are mounted on insulating substrate 12. While the time constant CR of the circuit comprising these components is being measured, a laser beam is applied onto function-trimming resistor 28, thus cutting notch 32 in resistor 28, and further cutting the intermediate portion of conductor 24 into two parts 24a and 24b. As a result, these portions 24a and 24b are connected by function-trimming resistor 28. The laser beam is continuously applied onto resistor 8 until notch 32 elongates such that the resistance between pad portions 14 and 22, i.e., $(R_1+R_2)$, is changed to resistance $R_f$, i.e., the desired resistance of the thick-film integrated circuit device. Both resistors 26 and 28 have a relatively small size, e.g., 1 mm×3 mm. Therefore, the resistance $(R_1+R_2)$ can greatly vary when resistors 26 and 28 are slightly trimmed.

As has been described, resistance-trimming resistor 26 is first trimmed to have resistance $R_1$ which is substantially equal to the resistance between pad portions 14 and 22. This resistance is of such value that the difference between it and the desired resistance $R_f$ is far less than 10 to 25%. In order words, the difference between the desired resistance $R_f$ and the resistance between pad portions 14 and 22 can be greatly reduced by trimming only resistance-trimming resistor 26. This is because resistance $R_2$ of function-trimming resistor 28 does not influence the resistance between pad portions 14 and 22. The resistance difference is further reduced by cutting notch 32 in function-trimming resistor 28 and by, simultaneously, cutting the intermediate portion of second conductor 24 into two portions 24a and 24b. When the intermediate portion of second conductor 24 is cut into these two portions, the resistance $R_2$ of resistor 28 is added to the resistance $R_1$ of resistance-trimming resistor 26. Since the difference between the desired resistance $R_f$ and the resistance of the circuit device has been greatly reduced, it suffices to cut a short notch in function-trimming resistor 28. Hence, resistor 28 has a relatively broad current path. Since the current path of resistor 28 is board, heat is not generated in an abnormally great amount, in this current path.

A second embodiment of the present invention will now be described with reference to FIG. 3. In this embodiment, three conductors 18, 38, and 44 are formed on insulating substrate 12 by means of the thick-film forming method. First conductor 18 is identical to the first conductor used in the first embodiment (FIG. 1). Second conductor 38 consists of connecting portion 34 located close to connecting portion 16 of first conductor 18, and another connecting portion 36. Third conductor 44 consists of connecting portion 40 located near connecting portion 36 of second conductor 38, and pad portion 42. Resistance-trimming resistor 26 and function-trimming resistor 28, both being rectangular strips, are formed on insulating substrate 12 by means of the thick-film forming method. Function-trimming resistor 28 extends perpendicular to the line in which connecting portions 36 and 40 are arranged. One end of resistor 26 overlaps connecting portion 16 of first conductor 18, and is thus electrically coupled thereto. The other end of the resistor 26 overlaps connected portion 34 of second conductor 38, and is therefore electrically connected thereto. One end of function-trimming resistor 28 overlaps connecting portion 36 of second conductor 38 and also connecting portion 40 of third conductor 44, and thus connects second and third conductors 38 and 44.

In the second embodiment shown in FIG. 3, the resistance of function-trimming resistor 28 influences the resistance between pad portions 14 and 42 since it electrically connects two separate conductors 38 and 44. Therefore, resistor 28 has a sheet resistance far lower than that of resistance-trimming resistor 26, for example, one tenth or less of the sheet resistance of resistor 26. Both resistance-trimming resistor 26 and function-trimming resistor 28 are trimmed in the same manner as in the first embodiment (FIG. 1).

The second embodiment has the same advantage as the first embodiment. That is, resistance-trimming resistor 26 can be easily trimmed, and function-trimming resistor 28 can have a comparatively broad current path even after it has been trimmed, whereby heat is not generated in an abnormally great amount in the current path.

As has been described, in both embodiments of the present invention, the resistance-trimming resistor can easily be trimmed, and heat is not generated in an abnormally great amount in the current path of the function-trimming resistor. Hence, the thick-film integrated circuit devices of either embodiment can be manufactured with high yield.

What is claimed is:

1. A thick-film integrated circuit device comprising:
   an insulating substrate;
   first and second conductors formed on said insulating substrate and spaced apart from each other, at least one of said conductors having a substantially elongated intermediate portion;
   trimming resistor formed on said insulating substrate and having two ends overlapping and electrically connected to said first and second conductors for coarsely adjusting the resistance of the integrated circuit device; and
   function-trimming resistor formed on said insulating substrate in the form of a strip having two ends, one function-trimming resistor end extending from and electrically contacting said substantially elongated intermediate portion, for finely adjusting the resistance of the integrated circuit device, said function-trimming resistor having a negligibly low pre-trimmed resistance which is at most equal to one-tenth of the resistance of said trimming resistor.

2. A device according to claim 1, wherein said conductor having the substantially elongated intermediate portion has a straight portion.

3. A device according to claim 2, wherein said function-trimming resistor is trimmed such that the substantially elongated intermediate portion of said conductor is cut into two parts.

4. A device according to claim 1, wherein said conductor having said elongated intermediate portion is cut into two parts before said function-trimming resistor is trimmed.

5. A thick-film integrated circuit device comprising:
   an insulating substrate;
   first and second conductors formed on said insulating substrate and spaced apart from each other, at least one of said conductors having a substantially elongated intermediate portion;
   a first resistor formed on said insulating substrate and having two ends overlapping and electrically connected to said first and second conductors, said first resistor being trimmed so as to coarsely adjust the resistance of the integrated circuit device; and
   a second resistor formed on said insulating substrate in the form of a strip having two ends, one second resistor end extending from and electrically contacting said substantially elongated intermediate portion, said second resistor being trimmed so as to finely adjust the resistance of the integrated circuit device and having a resistance which is at most equal to one-tenth of the resistance of said first resistor.

6. A device according to claim 5, wherein said conductor having the substantially elongated intermediate portion has a straight portion.

* * * * *